(12) United States Patent
Lee et al.

(10) Patent No.: US 11,864,391 B2
(45) Date of Patent: Jan. 2, 2024

(54) MAGNETORESISTIVE RANDOM ACCESS MEMORY

(71) Applicant: UNITED MICROELECTRONICS CORP., Hsin-Chu (TW)

(72) Inventors: Kuo-Hsing Lee, Hsinchu County (TW); Sheng-Yuan Hsueh, Tainan (TW); Te-Wei Yeh, Kaohsiung (TW); Chien-Liang Wu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/088,761

(22) Filed: Dec. 26, 2022

(65) Prior Publication Data

US 2023/0135847 A1 May 4, 2023

Related U.S. Application Data

(63) Continuation of application No. 16/924,169, filed on Jul. 8, 2020, now Pat. No. 11,569,295.

(30) Foreign Application Priority Data

Jun. 11, 2020 (CN) .......................... 202010528241.9

(51) Int. Cl.
*H10B 61/00* (2023.01)
*G11C 7/18* (2006.01)
*H10N 50/80* (2023.01)

(52) U.S. Cl.
CPC ............... *H10B 61/20* (2023.02); *G11C 7/18* (2013.01); *H10N 50/80* (2023.02)

(58) Field of Classification Search
CPC ........... H10B 61/20; H10N 50/80; G11C 7/18
USPC ......................................................... 257/421
See application file for complete search history.

(56) References Cited

U.S. PATENT DOCUMENTS

| 8,865,481 B2 | 10/2014 | Li et al. | |
| 10,290,679 B1 * | 5/2019 | Bhushan | ................ H10N 50/80 |
| 2010/0054028 A1 | 3/2010 | Xia | |
| 2019/0348540 A1 * | 11/2019 | Pillarisetty | ...... H01L 21/823475 |
| 2019/0363087 A1 * | 11/2019 | Zhou | ...................... H10B 63/80 |
| 2019/0371383 A1 * | 12/2019 | Chiang | .................. H10N 50/80 |

* cited by examiner

*Primary Examiner* — Jami Valentine Miller
(74) *Attorney, Agent, or Firm* — Winston Hsu

(57) ABSTRACT

A magnetoresistive random access memory (MRAM) includes a first transistor and a second transistor on a substrate, a source line coupled to a first source/drain region of the first transistor, and a first metal interconnection coupled to a second source/drain region of the first transistor. Preferably, the first metal interconnection is extended to overlap the first transistor and the second transistor and the first metal interconnection further includes a first end coupled to the second source/drain region of the first transistor and a second end coupled to a magnetic tunneling junction (MTJ).

1 Claim, 2 Drawing Sheets

MAGNETORESISTIVE RANDOM ACCESS MEMORY

CROSS REFERENCE TO RELATED APPLICATIONS

This application is a continuation application of U.S. application Ser. No. 16/924,169, filed on Jul. 8, 2020. The content of the application is incorporated herein by reference.

BACKGROUND OF THE INVENTION

1. Field of the Invention

The invention relates to a layout pattern for magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a magnetoresistive random access memory (MRAM) includes a first transistor and a second transistor on a substrate, a source line coupled to a first source/drain region of the first transistor, and a first metal interconnection coupled to a second source/drain region of the first transistor. Preferably, the first metal interconnection is extended to overlap the first transistor and the second transistor and the first metal interconnection further includes a first end coupled to the second source/drain region of the first transistor and a second end coupled to a magnetic tunneling junction (MTJ).

According to another aspect of the present invention, a magnetoresistive random access memory (MRAM) includes: a gate structure extending along a first direction on a substrate; a first diffusion region and a second diffusion region extending along a second direction adjacent to two sides of the gate structure; a first source/drain region on the first diffusion region adjacent to one side of the gate structure; a second source/drain region on the second diffusion region adjacent to another side of the gate structure; and a first metal interconnection overlapping the first source/drain region and the second source/drain region.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
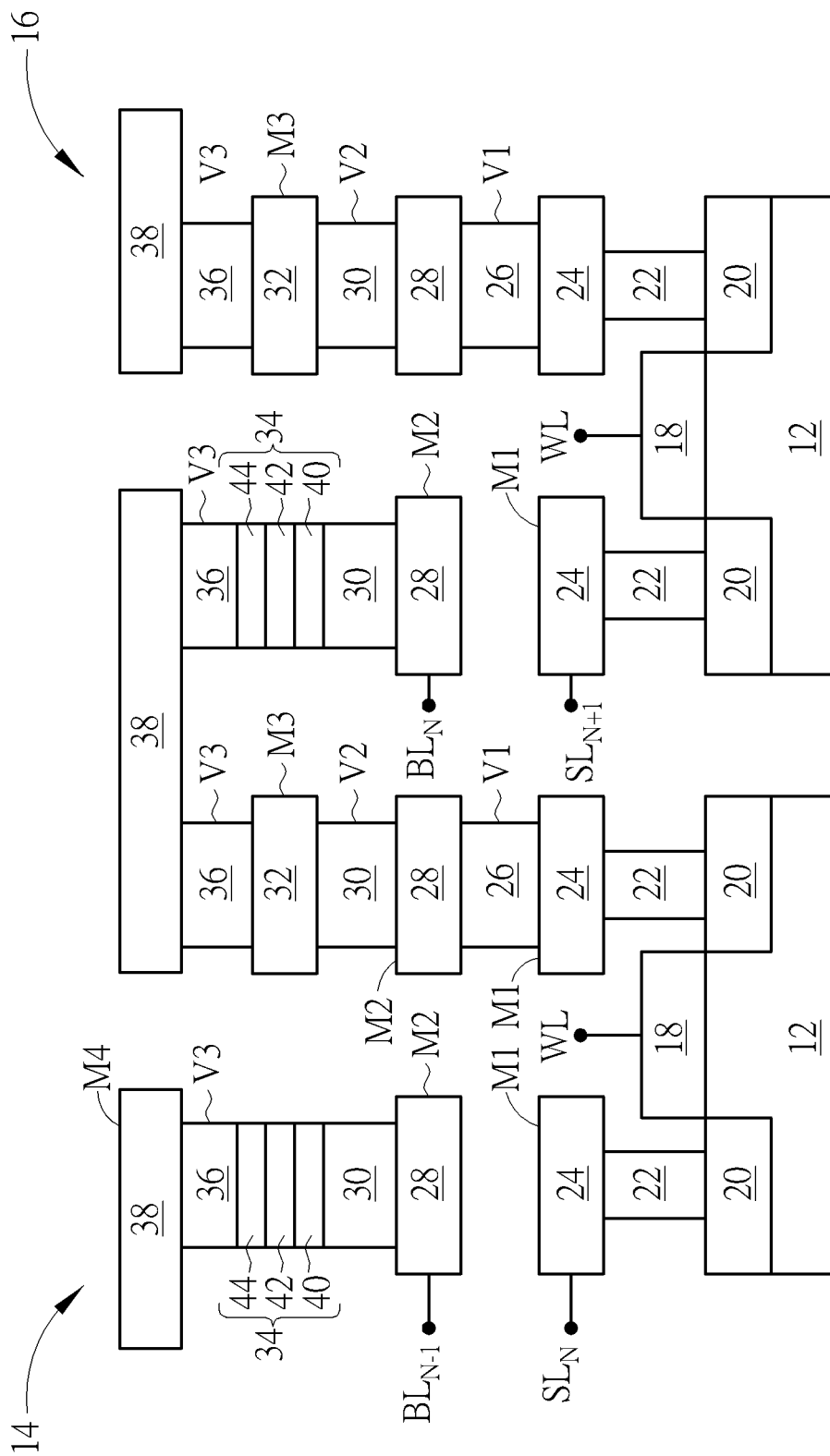
FIG. 1 illustrates a structural view of a MRAM device according to an embodiment of the present invention.

Referring to FIG. 1, FIG. 1 illustrates a structural view of a semiconductor device, or more specifically a MRAM device according to an embodiment of the present invention. As shown in FIG. 1, the MRAM device preferably includes two transistors such as a first transistor 14 and a second transistor 16 disposed on a substrate 12 made of semiconductor material, in which the semiconductor material could be selected from the group consisting of silicon (Si), germanium (Ge), Si—Ge compounds, silicon carbide (SiC), and gallium arsenide (GaAs).

In this embodiment, each of the first transistor 14 and the second transistor 16 could include metal-oxide semiconductor (MOS) transistors and in addition to active devices such as the MOS transistors, elements including passive devices, conductive layers, and interlayer dielectric (ILD) layer could also be formed on top of the substrate 12. More specifically, each of the first transistor 14 and the second transistor 16 could include planar MOS transistors or non-planar (such as FinFETs) MOS transistors, in which the MOS transistors could include transistor elements such as gate structures 18 (for example metal gates) and source/drain regions 20, spacers, epitaxial layers, and contact etch stop layer (CESL). Since the fabrication of planar or non-planar transistors and ILD layer is well known to those skilled in the art, the details of which are not explained herein for the sake of brevity.

The MRAM device further includes contact plugs 22 connected to the source/drain regions 20 of the first transistor 14 and the second transistor 16, metal interconnections 24 disposed on and coupled to the contact plugs 22, metal interconnections 26 disposed on and coupled to the metal interconnections 24, metal interconnections 28 disposed on and coupled to the metal interconnections 26, metal interconnections 30 disposed on and coupled to the metal interconnections 28, metal interconnections 32 disposed on and coupled to the metal interconnections 30, MTJs 34 disposed on and coupled to the metal interconnections 30, metal interconnections 36 disposed on and coupled to the metal interconnections 32 and MTJs 34, metal interconnections 38 disposed on and coupled to the metal interconnections 36. It should be noted that dielectric material such as inter-metal dielectric (IMD) layer and/or stop layer is disposed surrounding the contact plugs 22, the metal interconnections 24, 26, 28, 30, 32, 36, 38, and the MTJs 34. Nevertheless these dielectric materials are not shown in the figure for sake of brevity.

In this embodiment, each of the metal interconnections 24, 26, 28, 30, 32, 36, 38 could be embedded in the IMD layer and/or stop layer and electrically connected to each other according to single damascene or dual damascene processes. For instance, each of the metal interconnections 24 include a trench conductor, each of the metal interconnections 26 include a via conductor, each of the metal interconnections 28 include a trench conductor, each of the metal interconnections 30 include a via conductor, each of the metal interconnections 32 include a trench conductor, each of the metal interconnections 36 include a via conductor, and each of the metal interconnections 38 include a trench conductor. Preferably, the metal interconnections 24 are also referred to as first level metal interconnections M1, the metal interconnections 26 are also referred to as first level vias V1, the metal interconnections 28 are also referred to as second level metal interconnections M2, the metal interconnections 30 are also referred to as second level vias V2, the metal interconnection 32 are also referred to as third level metal interconnections M3, the metal interconnections 36 are also referred to as third level vias V3, and the metal interconnections 38 are also referred to as fourth level metal interconnections M4.

Moreover, each of the metal interconnections 24, 26, 28, 30, 32, 36, 38 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal interconnections 24, 26, 28, 32, 36, 38 preferably include copper, the metal interconnections 30 directly coupled to the MTJs 34 preferably include tungsten while other metal interconnections 30 not coupled to the MTJs 34 preferably include copper, the IMD layers preferably includes silicon oxide, and the stop layers preferably include nitrogen doped carbide (NDC), silicon nitride, silicon carbon nitride (SiCN), or combination thereof.

In this embodiment, the formation of the MTJs 34 could be accomplished by sequentially forming a bottom electrode layer, a pinned layer 40, a barrier layer 42, a free layer 44, and a top electrode layer. In this embodiment, the bottom electrode layer and the top electrode layer are preferably made of conductive material including but not limited to for example Ta, Pt, Cu, Au, Al, or combination thereof. The pinned layer 40 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 40 is formed to fix or limit the direction of magnetic moment of adjacent layers. The barrier layer 42 could be made of insulating material including but not limited to for example oxides such as aluminum oxide (AlOx) or magnesium oxide (MgO). The free layer 44 could be made of ferromagnetic material including but not limited to for example iron, cobalt, nickel, or alloys thereof such as cobalt-iron-boron (CoFeB), in which the magnetized direction of the free layer 44 could be altered freely depending on the influence of outside magnetic field.

Preferably, the source/drain region 20 on one side such as left side of the first transistor 14 is coupled to a source line $SL_N$ through the contact plug 22 and metal interconnection 24, the gate structure 18 of the first transistor 14 is coupled to a word line WL, the source/drain region 20 on another side such as right side of the first transistor 14 is coupled to the metal interconnection 38 through the contact plug 22, the metal interconnection 24, the metal interconnection 26, the metal interconnection 28, the metal interconnection 30, the metal interconnection 32, and the metal interconnection 36. The metal interconnection 38 preferably includes a first end and a second end, in which the first end is coupled to the source/drain region 20 of the first transistor 14 while the second end is coupled to the MTJ 34 through the metal interconnection 36.

As stated previously, each of the MTJs 34 includes a free layer 44, a barrier layer 42, and a pinned layer 40, in which the free layer 44 is directly coupled to the metal interconnection 36 while the pinned layer 40 is coupled to a bit line $BL_N$ through the metal interconnections 28 and 30. Preferably, metal interconnection 28 coupled to a previous transistor, metal interconnection 30, MTJ 34, metal interconnection 36, and metal interconnection 38 are disposed directly on or overlapping the source/drain region 20 on left side of the first transistor 14, in which another end of the metal interconnection 28 is coupled to a bit line $BL_{N-1}$. Similar to the first transistor 14, the source/drain region 20 on left side of the second transistor 16 is coupled to a source line $SL_{N+1}$ through the contact plug 22 and metal interconnection 24, and the source/drain region 20 on right side of the second transistor 16 on the other hand is coupled to the fourth level metal interconnection 38 or M4 through the contact plug 22, the metal interconnection 24, the metal interconnection 26, the metal interconnection 28, the metal interconnection 30, the metal interconnection 32, and the metal interconnection 36. Similar to the metal interconnection 38 overlapping both the first transistor 14 and the second transistor 16, one end of the metal interconnection 38 adjacent to the aforementioned metal interconnection 38 also on M4 level is coupled to the source/drain region 20 on right side of the second transistor 16 while the other end of the same metal interconnection 38 is coupled to a MTJ (not shown in FIG. 1) as the metal interconnection 38 overlaps the second transistor 16 and another transistor (not shown) immediately adjacent to the second transistor 16 at the same time.

It should be noted that in contrast to the topmost level such as the fourth level metal interconnection M4 and MTJ only overlapping the source/drain regions 20 adjacent to two sides of the first transistor 14 and without overlapping any of the adjacent transistor in current MRAM device, the present embodiment preferably shifts the position of the topmost level such as the fourth level metal interconnection M4 toward the adjacent second transistor 16 so that the metal interconnection 38 overlaps part of the source/drain region 20 of the first transistor 14 and part of the source/drain region 20 of the second transistor 16 at the same time. Meanwhile, the MTJ 34 coupled to the first transistor 14 is also shifted to overlap the source/drain region 20 of the second transistor 16 as opposed to overlapping the source/drain region 20 of the first transistor 14 in current approach.

Moreover, in contrast to the second level metal interconnection M2 coupled to the source/drain region and bit line $BL_N$ in current MRAM device is disposed directly on top the first level metal interconnection M1 coupled to the source/drain on another side of the same transistor and the source line $SL_N$ to form equivalent capacitance, the present invention preferably places the second level metal interconnection M2 or 28 coupled to the source/drain region 20 on one side of the first transistor 14 and the bit line $BL_N$ directly on top of the first level metal interconnection M1 or 24 coupled to the source/drain region 20 adjacent to one side of the second transistor 16 and the source line $SL_{N+1}$ for forming equivalent capacitance.

By making the topmost level or the fourth level metal interconnection M4 and the second level metal interconnection M2 a one column shift so that the fourth level metal interconnection 38 overlaps two transistors including the aforementioned first transistor 14 and the second transistor 16 simultaneously and at the same time separating the metal interconnection 28 coupled to the bit line $BL_N$ from the metal interconnection 24 coupled to the source line $SL_N$, the present invention could significantly reduce the equivalence capacitance between the bit line $BL_N$ and the source line $SL_N$ for approximately 40% to 50% and improve the operation speed of the device substantially.

Figure 2:
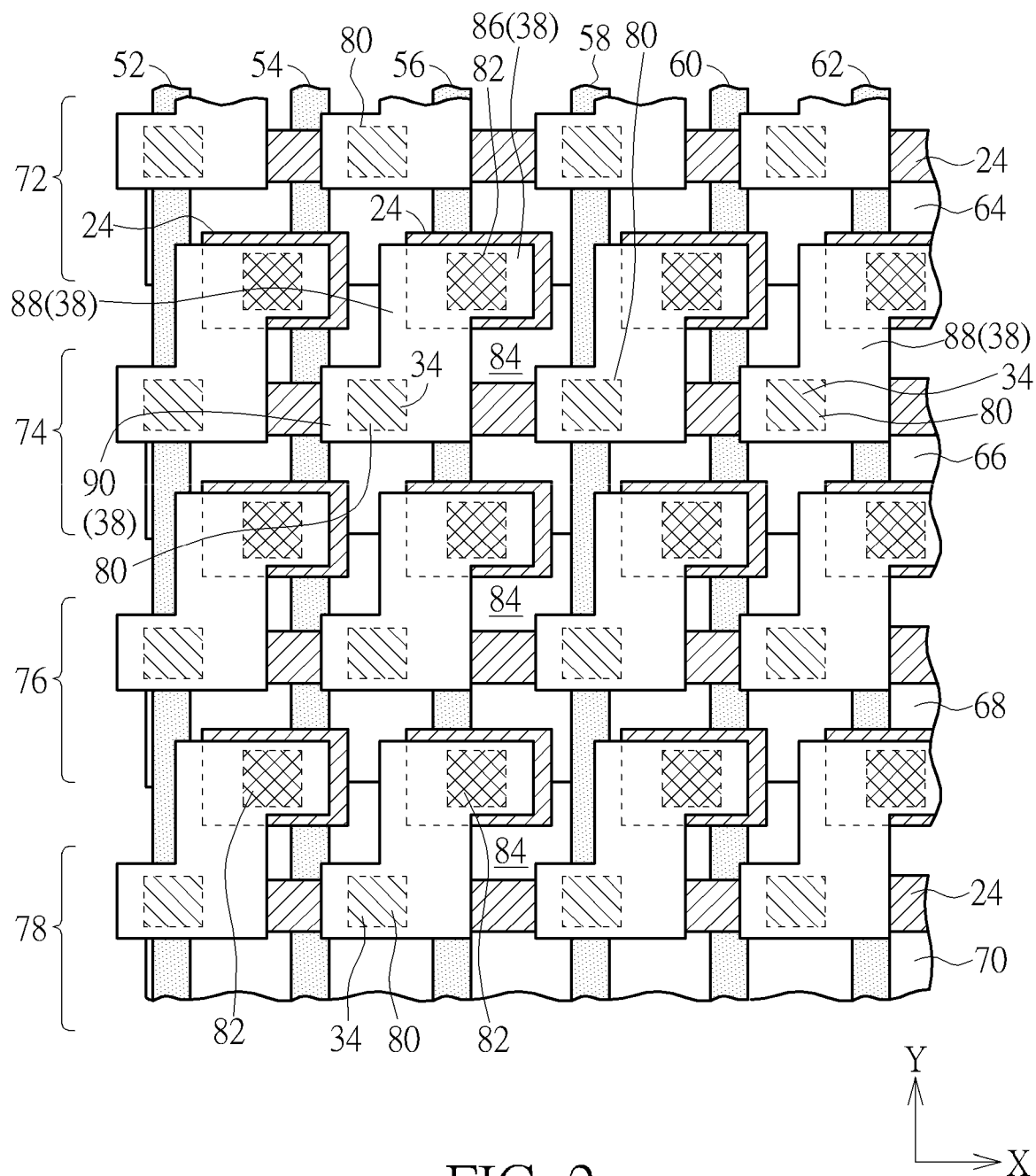
FIG. 2 illustrates a layout diagram of a MRAM device corresponding to the structure in FIG. 1 according to an embodiment of the present invention.

Referring to FIG. 2, FIG. 2 illustrates a layout diagram of a MRAM device corresponding to the structure in FIG. 1 according to an embodiment of the present invention. As shown in FIG. 2, the MRAM device includes a plurality of gate structures 52, 54, 56, 58, 60, 62 extending along a first direction such as Y-direction on the substrate 12, a plurality of doped or diffusion regions 64, 66, 68, 70 extending along a second direction such Y-direction adjacent to two sides of the gate structures 52, 54, 56, 58, 60, 62, a plurality of columns 72, 74, 76, 78 or horizontal regions defined extending along the second direction on the substrate 12, source/drain regions including source regions 80 and drain regions 82 disposed on the diffusion regions 64, 66, 68, 70 adjacent to two sides of the gate structures 52, 54, 56, 58, 60, 62, insulating region 84 such as shallow trench isolation (STI) disposed between the diffusion regions 64, 66, 68, 70, metal interconnections 24 extending along the second direction and overlapping the gate structures 52, 54, 56, 58, 60, 62 and source/drain regions adjacent to the gate structures 52, 54, 56, 58, 60, 62, and metal interconnections 38 extending from the diffusion regions 64, 66, 68 to the diffusion regions 66, 68, 70 and overlapping the source regions 80 and drain regions 82 on the diffusion regions. In this embodiment the metal interconnections 24 are the first level metal interconnections M1 and the metal interconnections 38 are the fourth level metal interconnections M4 shown in FIG. 1.

Viewing from a more detailed perspective, the metal interconnections 24 are preferably divided into two portions, in which one portion is extending along the X-direction while overlapping the upper portion of the diffusion regions 64, 66, 68, 70 and the other portion is overlapping the bottom portion of each of the diffusion regions 64, 66, 68, 70, part of the gate structures 54, 56, 60, 62, metal interconnections 38, and the source/drain regions such as drain regions 82. Each of the metal interconnections 38 if viewed from a top view perspective preferably includes a S-shape or a zigzag pattern. For instance, the metal interconnection 38 overlapping the gate structure 56 and the diffusion regions 64, 66 having zigzag pattern includes a first portion 86 extending along the X-direction while overlapping the gate structure 56 and drain region 82 on the diffusion region 64 adjacent to one side of the gate structure 56, a second portion 88 extending along the Y-direction while overlapping the insulating region 84, and a third portion 90 extending along the X-direction while overlapping the MTJ 34, the gate structure 56, and even part of the gate structure 54 and the source region 80 on the diffusion region 66 adjacent to another side of the gate structure 56, in which the first portion 86 also overlaps the metal interconnection 24.

Similar to FIG. 1, the topmost level such as the fourth level metal interconnection 38 in this embodiment are shifted from column 72 toward column 74 so that the metal interconnection 38 overlaps the source/drain region of the first transistor (such as the drain region 82 disposed on the diffusion region 64 adjacent to one side of the gate structure 56 or within the column 72) and the source/drain region of the second transistor (such as the source region 80 disposed on the diffusion region 66 adjacent to another side of the gate structure 56 or within the column 74) at the same time, in which the drain region 82 could represent the source/drain region 20 on right side of the first transistor 14 in FIG. 1 and the source region 80 could represent the source/drain region 20 on left side of the second transistor 16.

Overall, in contrast to the topmost or fourth level metal interconnection M4 in current MRAM device only overlaps the source/drain region adjacent to two sides a the transistor without overlapping any of the adjacent transistor, the present invention preferably shifts the topmost level such as the fourth level metal interconnection M4 toward the adjacent transistor so that the topmost level metal interconnection 38 overlaps the source/drain region 20 of the first transistor 14 and the source/drain region 20 of the second transistor 16 at the same time. In the meantime, the MTJ 34 and the second level metal interconnection M2 coupled to the first transistor 14 also overlaps the source/drain region 20 of the second transistor 16 after the position shift. Preferably, by making the topmost level or the fourth level metal interconnection M4 and the second level metal interconnection M2 a one column shift so that the fourth level metal interconnection 38 overlaps two transistors including the aforementioned first transistor 14 and the second transistor 16 simultaneously and at the same time separating the metal interconnection 28 coupled to the bit line $BL_N$ from the metal interconnection 24 coupled to the source line $SL_N$, the present invention could significantly reduce the equivalence capacitance between the bit line $BL_N$ and the source line $SL_N$ for approximately 40% to 50% and improve the operation speed of the device substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A magnetoresistive random access memory (MRAM), comprising:
 a first transistor and a second transistor on a substrate;
 a source line coupled to a first source/drain region of the first transistor; and
 a first metal interconnection directly coupled to a second source/drain region of the first transistor, wherein the first metal interconnection is extended to overlap the second transistor.

* * * * *